(12) United States Patent
Sokoluk et al.

(10) Patent No.: US 6,280,904 B1
(45) Date of Patent: *Aug. 28, 2001

(54) PHOTO-CHEMICAL GENERATION OF STABLE FLUORESCENT DERIVATIVES OF RHODAMINE B

(75) Inventors: Natalia T. Sokoluk; Vladimir V. Shubin, both of Moscow (RU); Eugene B. Levich, Tel Aviv; Jacob N. Malkin, Ashdod, both of (IL)

(73) Assignee: Tridstore IP, LLC, New York, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/506,027

(22) Filed: Feb. 17, 2000

Related U.S. Application Data

(62) Division of application No. 08/989,461, filed on Dec. 12, 1997, now Pat. No. 6,027,855.
(60) Provisional application No. 60/032,581, filed on Dec. 20, 1996.

(51) Int. Cl.[7] ....................................... G11B 7/24
(52) U.S. Cl. ................ 430/270.15; 430/945; 430/19; 365/119; 365/107; 365/120
(58) Field of Search ................. 430/945, 270.15, 430/19; 365/119, 107, 120

(56) References Cited

U.S. PATENT DOCUMENTS

| | | | |
|---|---|---|---|
| 5,008,521 | * 4/1991 | Ohki et al. | 235/454 |
| 5,325,324 | * 6/1994 | Rentzepis et al. | 365/127 |
| 6,027,855 | * 2/2000 | Sokoluk et al. | 430/270.15 |

FOREIGN PATENT DOCUMENTS

| | | |
|---|---|---|
| 61-202884 | * 9/1986 | (JP) . |
| 61-203450 | * 9/1986 | (JP) . |
| 03-220549 | * 9/1991 | (JP) . |
| 05-208557 | * 8/1993 | (JP) . |
| 05-254254 | * 10/1993 | (JP) . |
| 08-332776 | * 12/1996 | (JP) . |

OTHER PUBLICATIONS

Knauer et al., "photochromism or rhodamine derivatives", Angew. Chem. vol. 89(2) pp. 116–117, 1977.*

Willwohl et al., "Kinetics and mechanism of the photochromism of n–phenyl rhodmainelactame", Laser Chem., vol. 10. pp. 63–72, 1989.*

* cited by examiner

*Primary Examiner*—Martin Angebranndt
(74) *Attorney, Agent, or Firm*—Blank Rome Comisky & McCauley LLP

(57) ABSTRACT

The present invention relates to the field of optical recording materials, in particular, fluorescent compounds and matrices suitable for use in optical memory systems, including three dimensional optical memory systems for READ ONLY MEMORY (ROM). In particular, nonfluorescent Rhodamine B lactams are photochemically transformed into fluorescent Rhodamine B derivatives.

16 Claims, 1 Drawing Sheet

PHOTO-CHEMICAL GENERATION OF STABLE FLUORESCENT DERIVATIVES OF RHODAMINE B

This application is a divisional application of Application Ser. No. 08/989,461 filed on Dec. 12, 1997 now U.S. Pat. No. 6,027,855, issued on Feb. 22, 2000 which in turn claims the benefit of U.S. Provisional Application Ser. No. 60/032, 581 now abandoned, filed on Dec. 20, 1996, the subject matter of which is incorporated herein by reference in its entirety.

FIELD OF THE INVENTION

The present invention relates to the field of optical recording materials, in particular, fluorescent compounds and matrices suitable for use in optical memory systems, including three dimensional optical memory systems for READ ONLY MEMORY (ROM).

BACKGROUND OF THE INVENTION

Information storage and optical recording systems are of rapidly increasing importance in the modern society in view of the exponential rise in the number and complexity of the data which must be recorded and be retrievable so as to handle the increasing everyday business workload, and to assist efficiently enough in scientific development. Many optical information storage systems, including those based on silver halide emulsions and the like, have contributed significantly to this development, generally because of the high packing density combined with good resolution of information retrieve inherent to such systems. The advantage of READ ONLY MEMORY devices, based on photo-chemical generation of fluorescent compounds lies in the fact that storage of information in such systems is rapid and accurate, and there is no fixing required. Reading is also rapid, exceptionally sensitive and accurate and is not accompanied by degradation. At the same time there is another requirement the modern optical storage systems should comply with. The reading process should be non destructive for the memory material so as to enable repeating of reading thousands of times without detectable deterioration of the medium material. The reading process, can be carried out either by scanning point by point of the same layer, i.e. bit by bit of information, or by simultaneous reading from a 2-D layer carrying a medium material with the data recorded therein. In this manner a very fast access time to the stored information can be achieved. Reading of this type can be implemented by illumination of a 2-D layer by a fiber optics means. The intensity of illumination radiation should be sufficient for triggering fluorescence within the medium material accompanied by subsequent fluorescent photo-emission from all sites of the layer where the data have been stored.

Various methods and systems of recording of information based on generation of fluorescent compounds obtained from non-fluorescent precursor have been proposed.

The known methods include, for example, UV irradiation of bis-diarylchloromethyl-1,3,4-oxadiazoles as described by Singh in U.S. Pat. No. 3,869,363, herein incorporated for reference. There are known also many others systems as described by Zweig in the paper "Photochemical Generation of Stable Fluorescent Compounds", Pure and Applied Chemistry, vol. 33, pages 389–410 (1973), herein incorporated for reference.

The main common feature of the prior art optical memory systems is associated with the fact that reading in those systems can be implemented only by lasers having wavelength shorter than 500 nm. It can be appreciated that this requirement prevents employing of modern lasers with longer wavelength.

Furthermore, there exists another requirement to the optical memory systems. This requirement is associated with the fact that the intermediate photo-induced fluorescent product should be thermally and photo-chemically stable otherwise it can be destroyed by the reading process itself. Unfortunately the known in the art materials employed in optical memory systems are not sufficiently stable.

OBJECTS AND SUMMARY OF THE INVENTION

It is therefore the primary object of the present invention to provide a method of recording of information within a 3-D Read Only Memory devices enabling high efficiency of writing in terms of quantum yield of the photo-transformation and in terms of quantum yield of the fluorescence produced by the photo-induced form of the medium material.

The other object of the present invention is to provide for a medium material suitable for use in an optical storage memory system, which is defined by high thermal and photochemical stability.

SUMMARY OF THE INVENTION

Rhodamine B lactams have been known for a long time for use as coloring element in thermo- and piezo-sensitive papers, as described in U.S. Pat. No. 3,922,283 by M. Iahargi, S. Horiuchi and in Japanese patent 11660 (1972) by M. Sadao, O. Misaoki and F. Mitsuru and in U.S. Pat. No. 4,599,630 by K. Ohtaki and H. Sakamoto herein incorporated for reference.

The Rhodamine-B lactams have been recognized as suitable coloring additive for chemical sensors however they were not considered in connection with optical recording of information. Despite the fact that Rhodamine B lactams are well known compounds there was not known about their ability to undergo photo-transformation under illumination by long wave electromagnetic radiation with subsequent formation of fluorescent derivatives and therefore about their suitability for optical storage memory systems.

In accordance with the present invention it has been surprisingly discovered that the transformation of a Rhodamine-B lactam into respective Rhodamine derivative can be successfully implemented for recording of information in various optical memory systems by virtue of the fact that Rhodamine derivatives exhibit induced fluorescence when illuminated by a long wave radiation. The induced fluorescence can be detected for example by a CCD camera.

DETAILED DESCRIPTION OF THE PREFERRED EMBODIMENTS

Figure 1:
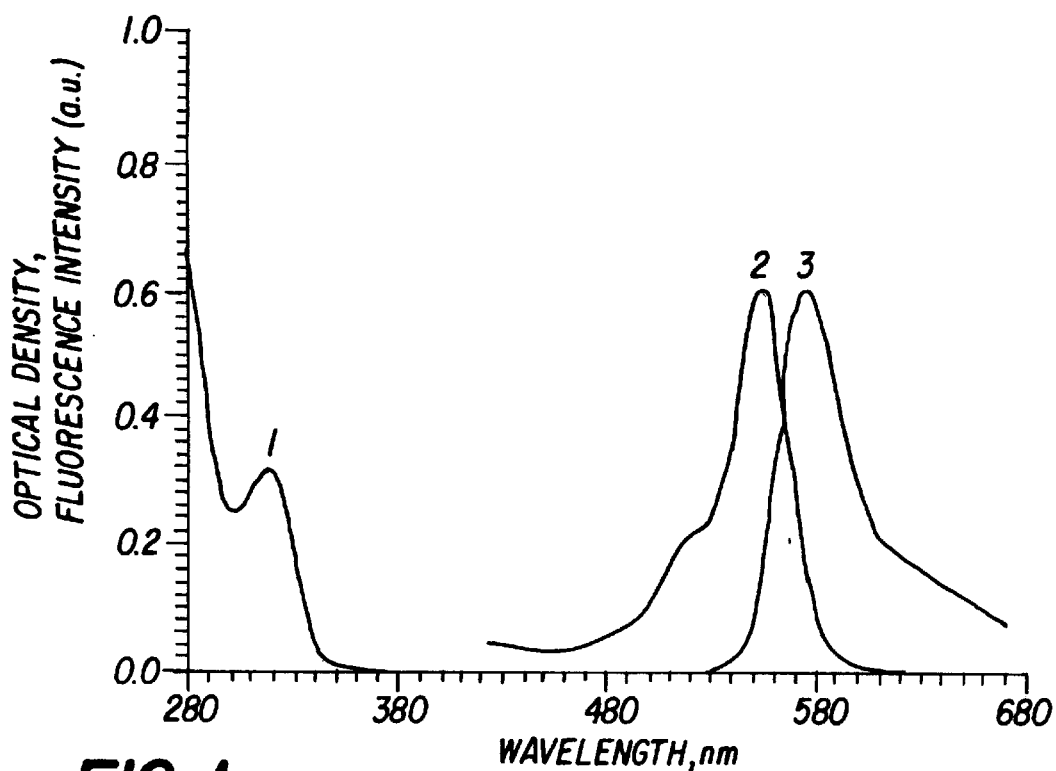
FIG. 1 shows fluorescence spectra of a Rhodamine B derivative in accordance with the present invention.

Thus the active medium in accordance with the present invention includes a material existing in a first, non-fluorescent form, capable of photo-transformation into a second, fluorescent form. A longer wavelength irradiation is then applied to cause the second form to fluoresce and thus to display an image which can be detected, for example by a CCD camera.

For this purpose there are employed suitable compounds disclosed further and designated for the sake of brevity as D. Among those compounds are Rhodanine B lactams having general formula:

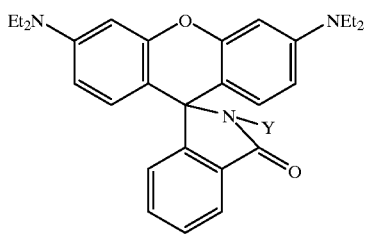

where Y is phenyl; o-, m- and p-halogenphenyl, o-, m- and p-alkylphenyl (alkyl-$C_1$–$C_{18}$)

In accordance with the present invention it has been empirically found that a group of compounds existing in a form D undergo photo-transfornation into a fluorescent form E according to the following equation:

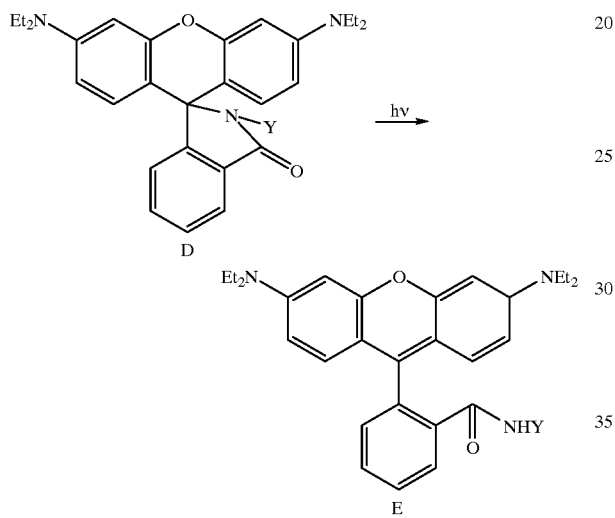

The preparation of compounds D is described in details in M. Iahargi,; S. Horiuchi in U.S. Pat. No. 3,922,283 which is incorporated herein by reference.

For synthesis of a compound D to the mixture of 102 g Rhodamine B, 408 g toluene and 204 g o-chloroaniline 60.7 g of phosphorus chloroxide had been added. The temperature of the solution was increased up to 100° C. The mixture was mixed for 1 hour at 100° C., after that the extra quantity of toluene and o-chloroaniline had been separated by distillation with water vapor, the rest had been extracted with 100 ml of toluene, rinsed with water solution of NaOH, and the extra quantity of toluene had been separated by distillation. The rest had been diluted with 300 ml of methanol and 100 g of o-chloroanilide of Rhodamine B had been isolated after drying out for 2 hr at 70° C. It should be realized that the above described method is only an example. Any other methods suitable for synthesis of Rhodamine-B lactams can be used by those skilled in the art.

Three different lactams designated correspondingly D1,D2,D3 were prepared by similar manner and their respective formulae are presented below.

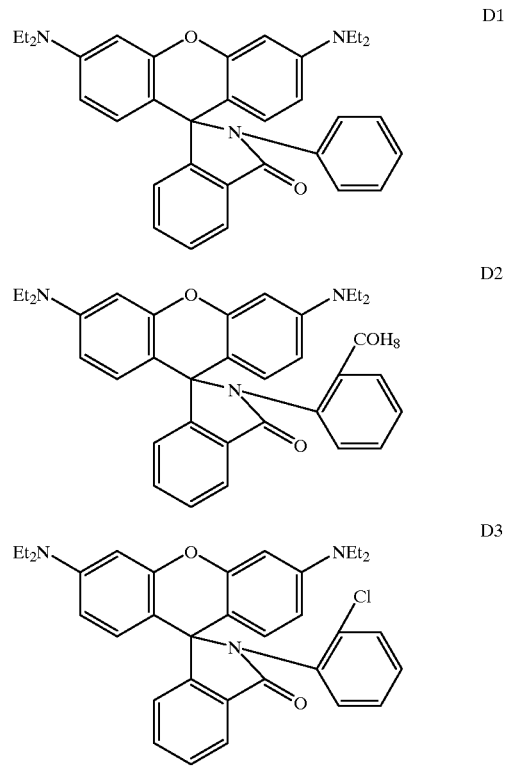

In the following non-limiting table 1 below are summarized spectral and luminescent properties of non-fluorescent lactams D together with similar properties of their corresponding fluorescent derivatives E.

TABLE 1

Spectral and Luminescent Properties of Lactams and respective Rhodamine derivatives in chloroform at 25° C.

| Compound | | $\lambda_{max}^D$ (nm) | $\epsilon_{max}^D$ (mol$^{-1}$ l cm$^{-1}$) | $\lambda_{max}^E$ (nm) | $\psi_{DE}$ | $\psi_{F1}^E$ |
|---|---|---|---|---|---|---|
| D1 | Et$_2$N—[structure]—NEt$_2$ | 320 | 12880 | 574 | 0.14 | 0.72 |

TABLE 1-continued

Spectral and Luminescent Properties of Lactams and respective Rhodamine derivatives in chloroform at 25° C.

| Compound | $\lambda_{max}^D$ (nm) | $\epsilon_{max}^D$ (mol$^{-1}$ l cm$^{-1}$) | $\lambda_{max}^E$ (nm) | $\psi_{DE}$ | $\psi_{F1}^E$ |
| --- | --- | --- | --- | --- | --- |
| D2 (Et$_2$N-...-NEt$_2$ structure) | 320 | 12400 | 574 | 0.08 | 0.99 |
| D3 (Et$_2$N-...-NEt$_2$, Cl structure) | 320 | 12880 | 578 | 0.18 | 0.68 |

In the following non-limiting table 2 below are summarized properties of the above compounds D, incorporated within a polymer film.

TABLE 2

Spectral and Luminescent Properties of the Rhodamine B lactams and respective Rhodamines in polystyrene film at 25° C.

| Compound | $\lambda_{max}^D$ (nm) | $\lambda_{max}^E$ (nm) | $\psi_{DE}$ | $\psi_{F1}^E$ |
| --- | --- | --- | --- | --- |
| D1 (Et$_2$N-...-NEt$_2$ structure) | 313 | 590 | — | 0.34 |
| D2 (Et$_2$N-...-NEt$_2$ structure) | 308 | 600 | — | 0.64 |

TABLE 2-continued

Spectral and Luminescent Properties of the Rhodamine B lactams and respective Rhodamines in polystyrene film at 25° C.

| Compound | $\lambda_{max}^D$ (nm) | $\lambda_{max}^E$ (nm) | $\psi_{DE}$ | $\psi_{F1}^E$ |
|---|---|---|---|---|
| D3 [Et₂N-xanthene-NEt₂ with Cl-phenyl lactam structure] | 312 | 590 | — | 0.39 |

In the above tables $\lambda_{max}^D$ and $\lambda_{max}^E$ are absorption maxima of form D and E, $\epsilon_{max}^D$ is extinction coefficient of form D, $\psi_{DE}$ is quantum yield of the photo-transformation of form D into E for the irradiation wavelength of 320 mn and $\psi_{F1}^E$ is quantum yield of the fluorescence of form E at excitation with 590 nm.

Now with reference to the following non-limiting examples it will be described how an active medium containing the above mentioned compounds can be manufactured.

EXAMPLE 1

In this example a solution of 0.0086 g of lactam D1 was mixed with the solution of 0.02 g polystyrene in chloroform. The ready composition have been deposited on lavsan slide with the aim of applicator and was allowed to evaporate until the complete drying out for 1 hour at 70° C. The ready film having thickness 3 microns shows no fluorescence at 570 nm. After irradiation for 3 minutes with high pressure Hg-lamp (200 W) equipped with UFS glass filter the very contrast red photo-coloration has been got. When the film was irradiated at 320 nm the compound D1 was converted into compound E1, which exhibits a bright fluorescence.

With reference to FIG. 1 one can see the absorption spectra of compounds D1 and E1 (curves 1,2) and the fluorescence spectrum of compound E1 (curve 3).

EXAMPLE 2

In this example the mixture containing 0.0115 g of lactam D1, 0.0025 g of CBr₄, 1.1 cm³ of toluene and 1 cm³ of 2% solution of polystyrene in CHCl₃ have been deposited with the aim of applicator on the glass slide and was allowed to evaporate for 3–4 hours. Afterwards the ready film having thickness 5 microns was irradiated by high pressure Hg-lamp with light 320–360 nm (glass filter UFS-1) for 2 minutes. The photoinduced photo-coloration with $D_{563}$=1.08 has been got. The irradiated film was allowed to evaporate for 1 hour at 70° C. and for 30 minutes at 90° C. After the treatment the film was kept 4 months in dark place at room temperature. The change in photo-induced optical density ($D_{563}$=1.08) was less than 0.05%.

Thus writing of information can be implemented by causing the Rhodamine-B lactam to absorb the irradiated light and to transform into a Rhodamine derivative. The process of reading of the recorded information can be implemented by detecting the fluorescence emitted from the Rhodamine derivative.

The advantage of the present invention lies in the fact that the reading process can be carried out by excitation of the recording medium at 600 nm, and thus the modern miniature diode lasers can be employed.

Figure 2:
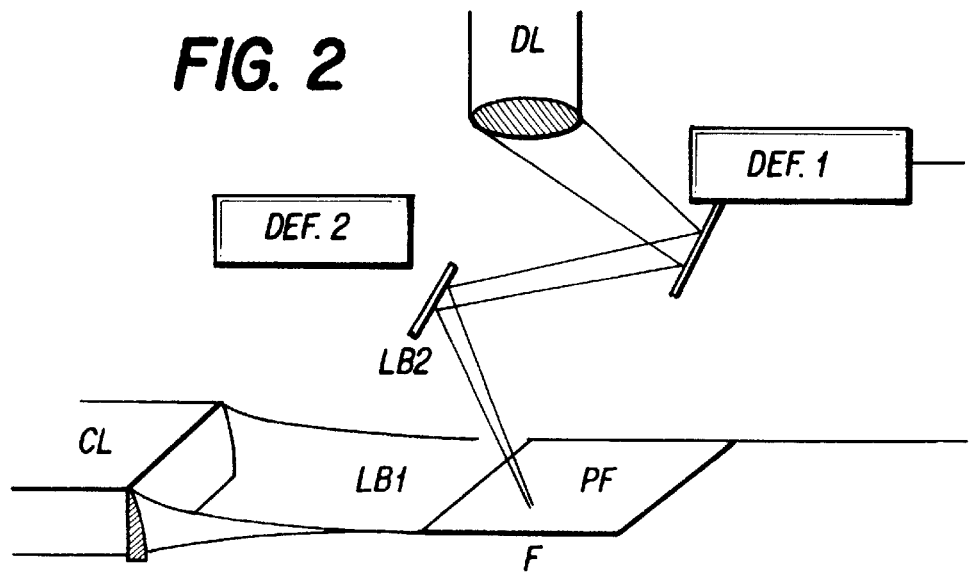
FIG. 2 represents experimental set-up suitable for two-photon writing of information into 3-D memory system.

The active medium in accordance with the present invention can be advantageously implemented in the process of 2 photon writing by virtue of a set-up as shown in FIG. 2.

Two laser beams LB1 and LB2 from two respective laser sources (not shown) are selectively directed onto the layer of polymeric film F constituting a matrix carrying an active medium incorporated therein. The composition of this medium is chosen in accordance with the present invention. The first beam is produced by a cylindrical lens CL and the second beam is produced by a diode laser DL. The second beam can be deflected by virtue of deflectors Def1 and Def2. The film is transparent to the electromagnetic radiation at least in some parts of the spectrum. The intersection of beam LB1 with the beam LB2 in a selected point of focus PF on the film is accompanied by a photo-chemical reaction in this selected location. In practice this location looks like a colored point. The laser beams can be displaced across the film and so the point of focus, which will describe a trajectory inside the polymeric film. The intersection of the trajectory with the active sites of the matrix is accompanied by writing of the binary data. The remaining part of material, that is the ones not intersected by this trajectory, is not affected since the irradiation intensity beyond the focus is less than the threshold required for transformation of the form D into form E.

In practice the writing was implemented by mode-locked Nd:Yag pico-second laser with the following parameters:

energy E(1064 nm)=0.3 μJ; E(532 nm)=0.03 μJ; P(1064 nm)=22 W; P(532 nm)=2 W; A(1064 nm)=3 μ×3 μ=10⁻⁷ cm²; A(532 nm)=30 μ×1 cm=3 10⁻³ cm²;

The beam at 532 nm was focused by the cylindrical lens creating flat beam with uniform thickness app. 30 microns (con-focal parameter in this case is about 1 cm). The intersection of this beam with focused beam at 1064 nm is followed by corresponding photo-transformation of form D into form E.

The photons emitted by form E can be deflected towards a CCD camera (not shown) and registered. This registration will constitute the process of reading. From a practical viewpoint the fluorescent response of the medium material presenting in the form E, with a written information recorded in it, would occur only if the intensity of the irradiation is sufficiently high. This second energy threshold, however, is lower than the threshold that should have been exceeded for writing.

The active medium in accordance with the present invention is characteristic by a very high photochemical stability: 180-hours irradiation of the film disclosed in Example 1 at the wavelength 580 nm (applied as an excitation source for reading) within the cell of the spectro-fluorimeter Shimadzu didn't lead to any visible changing in the intensity of the fluorescence of the photoinduced form E. Similar irradiation of the film carrying bis-di-m-anilinochloromethyl-1,3,4-oxadiazole as an active medium described in U.S. Pat. No. 3,869,363 resulted in reducing the fluorescence intensity by 2.6 times.

Although certain presently preferred embodiments of the present invention have been specifically described herein, it will be apparent to those skilled in the art to which the invention pertains that variations and modifications of the various embodiments shown and described herein may be made without departing from the spirit and scope of the invention. Accordingly, it is intended that the invention be limited only to the extent required by the appended claims and the applicable rules of law.

We claim:

1. An optical three dimensional memory system comprising a layer, said layer having an active medium responsive to electromagnetic radiation, said active medium comprising at least a non-fluorescent Rhodamine B compound having the structure D, which upon being irradiated is converted to a fluorescent state thereby storing information within said active medium

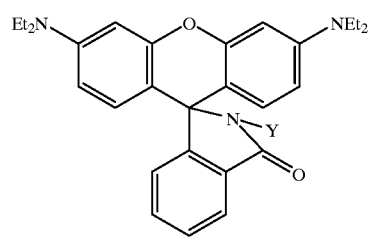

D wherein Y is selected from the group consisting of o-nitrophenyl, m-nitrophenyl, m-halogenophenyl, p-fluorophenyl, p-iodophenyl, alkylphenyl and o-methoxyphenyl.

2. The memory system of claim 1, wherein said radiation includes a laser, Hg-lamp or any other source of UV or visible light.

3. The memory system of claim 1, further including means for detecting said fluorescence.

4. The memory system of claim 1, further including a CCD camera for detecting fluorescence in said active medium.

5. The memory system of claim 1, wherein Y is o-methoxyphenyl.

6. The memory system of claim 1, wherein Y is m-chlorophenyl.

7. A method of optically recording information within a three dimensional memory system comprising an active medium including at least one non-fluorescent Rhodamine B lactam, comprising the steps of:

applying a first and second electromagnetic radiation to said non-fluorescent Rhodamine B lactam and transforming said compound into a fluorescent form, said first and second electromagnetic radiation having different wavelengths;

whereby said transformation from a non-fluorescent compound into a fluorescent compound takes place by photochemical reaction to record information in said active medium, and wherein said Rhodamine B lactam has the following structure:

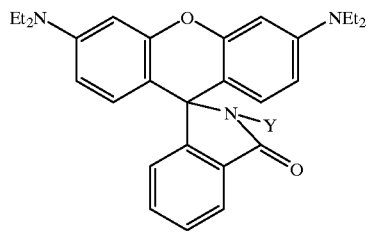

where Y is phenyl, nitrophenyl, halogenophenyl, alkylphenyl or o-methoxyphenyl.

8. The method of claim 7, further including the step of reading the record information.

9. The method of claim 8 wherein the recorded information is read by a CCD camera.

10. The method of claim 7, wherein Y is phenyl.

11. The method of claim 7, wherein Y is o-methoxyphenyl.

12. The method of claim 7, wherein Y is o-chlorophenyl.

13. The method of claim 7 wherein said radiation is applied by a laser, Hg lamp or any source of UV or visible light.

14. The method of claim 13, further including the step of detecting said fluorescence.

15. The method of claim 14, including a CCD camera for the detection.

16. The method of claim 7, further including the step of detecting said fluorescence.

* * * * *